(12) United States Patent
Howlett

(10) Patent No.: US 6,691,142 B2
(45) Date of Patent: Feb. 10, 2004

(54) PSEUDO RANDOM ADDRESS GENERATOR FOR 0.75M CACHE

(75) Inventor: Warren Kurt Howlett, Windsor, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 494 days.

(21) Appl. No.: 09/756,947

(22) Filed: Jan. 9, 2001

(65) Prior Publication Data

US 2002/0129071 A1 Sep. 12, 2002

(51) Int. Cl.[7] .................................................. G06F 1/02
(52) U.S. Cl. ........................................................ 708/252
(58) Field of Search ................................ 708/250–256; 380/46

(56) References Cited

U.S. PATENT DOCUMENTS

| 5,079,733 A | * | 1/1992 | Antoine et al. |
| 5,105,376 A | * | 4/1992 | Pedron |
| 5,867,409 A | * | 2/1999 | Nozuyama |
| 6,263,082 B1 | * | 7/2001 | Ishimoto et al. |
| 6,430,586 B1 | * | 8/2002 | Williams |
| 6,442,579 B1 | * | 8/2002 | Hansson .................... 708/252 |

* cited by examiner

Primary Examiner—Tan V. Mai

(57) ABSTRACT

The most significant N bits of each number in a pseudo random sequence are generated by unidirectionally shifting the previous bits from a first memory cell toward the Nth memory cell of a sequential register and generating a new bit in the first memory cell in response to a predetermined combination of the previous N bits through feedback logic, for example by NORing the previous N most significant bits, such that always at least one of the N bits is a zero. N most significant bits are matched with a least significant bits portion that cycles exactly once for each most significant bit value. This results in a pseudo random sequence excluding an upper fraction of one-fourth, one-eighth, . . . , (one-half)$^N$ of an otherwise power of two range. Embodiments include right or left shifting, generating reversed sequences, or coupled right- and left-shifting, in hardware or software implementations.

27 Claims, 2 Drawing Sheets

… (one-half)$^N$.

PSEUDO RANDOM ADDRESS GENERATOR FOR 0.75M CACHE

TECHNICAL FIELD

This application relates to built-in self-test (BIST) of semiconductor devices, and particularly to pseudo random address generators for testing of semiconductor cache memory devices.

BACKGROUND

Conventional cache memory devices are sized only in powers of two, e.g., 1024, 4096, etc. Self-testing of these devices is typically performed using an ordinary linear feedback shift register (LFSR) to generate pseudo random addresses over a corresponding range of a power of two. Hence, because there has been no prior motivation to develop a system or method to generate pseudo random addresses for testing a cache memory device having a size that is not a power of two, such systems and methods have not been taught or suggested.

For testing a cache memory size that is not a power of two, for example a 0.75M cache memory, although a conventional LFSR could have been used, illegal addresses would have been generated. An ordinary LFSR generates addresses in the hexadecimal range for example from 0 to 0x3fff (0 to 16383 decimal), whereas the hexadecimal range needed is from 0 to 0x2fff (0 to 12287 decimal). Thus it would be advantageous to develop a system and method of pseudo random address generation for cache testing, that avoids the upper quarter of an address range that otherwise would be a power of two.

SUMMARY OF THE INVENTION

The present invention is directed to a system for and method of generating pseudo random number sequences that exclude a predetermined upper fraction of a range that otherwise covers a power of two. The most significant N bits of each number are generated cyclically by unidirectionally shifting the bits of the previous number in the sequence from a first memory cell toward an Nth memory cell of a sequential register and generating a new bit in the first memory cell in response to a predetermined combination of the previous N most significant bits, such that always at least one of the N bits is a zero, thus excluding a predetermined upper fraction of a power of two range. For each number in the pseudo random sequence, the N most significant bits are matched with a least significant bits portion that is generated using conventional methodology, such that every value of the least significant bits portion is generated exactly once for each cyclic value of most significant bits.

In some embodiments the matching between most significant and least significant bits is discontinuously randomized by applying a shift control bit to the most significant bit portion obtained by ANDing the external shift control bit of the least significant bit portion with the bit value of a selected one of the least significant bits. Thus the most significant bits shift if and only if the values of both the external shift control bit and the selected least significant bit are high. In some embodiments the new value of the first of the most significant bits is obtained through feedback logic, for example by NORing the previous N most significant bits. The total number of bits in each pseudo random sequence number is not limited, but practical implementations are typically in the range from 4 to 64 bits. The number N of most significant bits can be selected in a range from two bits to the entire number of bits in the sequence number. This results in excluded upper range fractions of one-fourth, one-eighth, one-sixteenth, . . . , (one-half)$^N$.

Pseudo random sequence generators according to the present invention can be right shifting or left shifting, which generate sequences in reverse orders. Other implementations include coupled right- and left-shifting configurations. Both hardware and software implementations are available.

This solution according to the present invention is simple, still quite random, and generates a unique and reversible sequence. The system and method according to the present invention can be applied, typically through a parallel output bus, to the testing of cache memory devices having address ranges that are not powers of two, for example a 12 k or a 0.75M cache memory.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
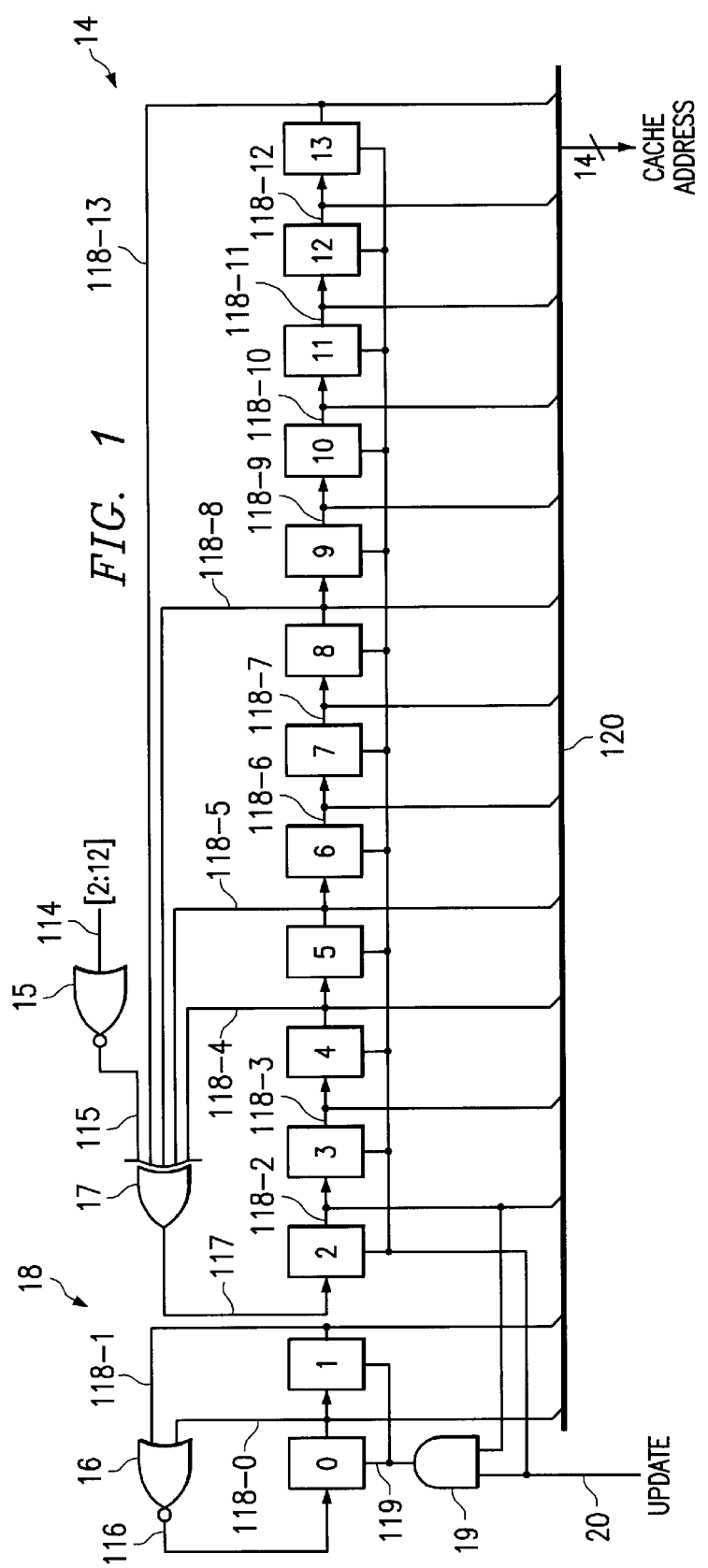
FIG. 1 is a simplified schematic diagram illustrating a device for generating a pseudo random hexadecimal sequence ranging from 0 to 0x2fff, according to an embodiment of the present invention.

FIG. 1 is a simplified schematic diagram illustrating a device for generating a pseudo random hexadecimal sequence ranging from 0 to 0x2fff, according to an embodiment of the present invention.

The device input 20 is a signal called 'update'. Device outputs include a 14-bit parallel bus 120 upon which a pseudo-random output sequence 118-0 through 118-13 appears. Elements 0 through 13 are all identical memory elements, each having two inputs and one output. The input on the left edge of each element is a data input (zero or one). The input on the bottom edge of an element is an update signal. A data output 118-0 through 118-13 is on the right edge of each respective element 0 through 13. When the update signal is high, the value appearing on the data input is stored. This stored value appears on the output some time later or at a later clock edge. In practice, memory elements 0 through 13 can be conventional master-slave latches, edge triggered flip-flops, or other memory cells.

The outputs for all memory elements 0 through 13 are the pseudo random output of the device and are connected to the address port of a cache memory through 14-bit parallel bus 120. Memory elements 2 through 13 in the right portion 14 of FIG. 1 are configured as a conventional 12-bit LFSR. These memory elements 2–13 contain the 12 least significant bits of each address in the pseudo random sequence. When the right 12 memory elements receive update signal 20, all of the stored bits simultaneously shift to the right by one, and a new binary value generated by a conventional exclusive-OR feedback circuit 17 is fed through interconnect 117 into memory element 2. Upon repeated updates, a pseudo-random sequence is generated, which does not repeat until all values are visited exactly once, as is well known in the art. A NOR gate 15 having an input 114 that includes all of the 11 outputs 118-2 through 118-12 from memory elements 2 through 12 handles the all-zero address scenario in a conventional fashion. Without it, the LFSR can never escape from an all-zero address, but will remain there forever.

Referring to the left portion 18 of FIG. 1, memory elements 0 and 1 contain the 2 most significant bits of each address in the pseudo random sequence, and have a specialized update signal 119 consisting of update signal 20 ANDed at gate 19 with output signal 118-2 from memory element 2 in the right portion of FIG. 1. The output signal from any other memory element in the right portion 14 could be used instead of memory element 2, with similar results. Accordingly memory element 2 is shown as an arbitrary example. This causes elements 0 and 1 to update only when update signal 20 and output signal 118-2 are both high. When specialized update signal 119 occurs, the binary value in memory element 0 shifts into memory element 1, and memory element 0 receives a new binary value from a NOR gate 16 through interconnect 116. The inputs to NOR gate 16 are the outputs 118-0 and 118-1 of memory elements 0 and 1 respectively. Table 1 describes how this binary logic behaves.

TABLE 1

| element number | value before shift 01 | value after shift 01 |
|---|---|---|
| | 00 | 10 |
| | 10 | 01 |
| | 01 | 00 |

The sequence of 00, 10, 01 repeats indefinitely. Importantly, the value 11 never occurs, and consequently the upper quarter of a power-of-two address range is excluded, as was desired. Right portion 14 cycles through its set of least significant bit values three times—each time matched up with a different unique value of most significant bits from right portion 18. That 'match up' is scrambled, such that the address sequence is still quite random. In other words, the device produces a sequence of pseudo random addresses that includes each address exactly once, until all addresses have been generated. This is analogous to what an LFSR does for a power of two range. The device in accordance with the present invention provides the analogous solution for a non power of two address range.

Figure 2:
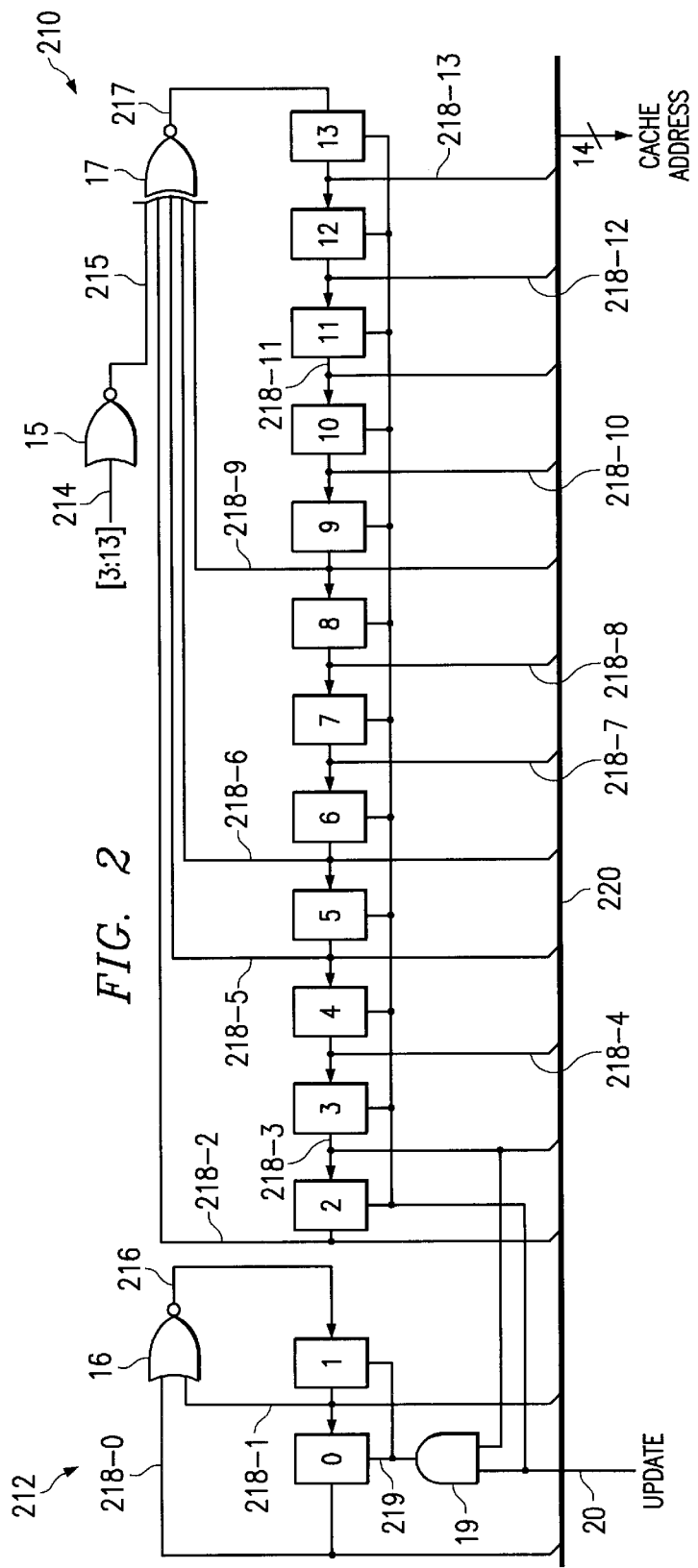
FIG. 2 is a simplified schematic diagram illustrating a device applying a left shift of bits for generating a pseudo random sequence as in FIG. 1.

The above considerations apply to the device shown in FIG. 1 having bits shifting to the right. FIG. 2 is a simplified schematic diagram illustrating a device applying a left shift of bits for generating a pseudo random sequence as in FIG. 1. The memory elements shown are the same as corresponding identically numbered memory elements shown in FIG. 1, except that the data input is on the right edge of each element and the output 218-0 through 218-13 is on the left edge, reversed relative to FIG. 1. Analogous to FIG. 1, the outputs are connected to the address port of a cache memory through a 14-bit parallel bus 220. NOR gate 15 performs the same function as in FIG. 1, except for having as inputs 214 all outputs 118-3 through 118-13 from memory elements 3 through 13. NOR gate 16 is the same as in FIG. 1, but is connected through an interconnect 216 to the input of element 1 instead of element 0. The specialized update signal 219 for elements 0 and 1 is the AND at gate 19 of update signal 20 and the output 218-3 of element 3 in place of element 2. As described above, element 3 is selected only for convenience of discussion, but the output signal from any other memory element in the right portion 210 could be used instead with similar results. Accordingly memory element 2 is shown as an arbitrary example. The binary logic table for the left portion of FIG. 2 is shown in Table 2.

TABLE 2

| element number | value before shift 01 | value after shift 01 |
|---|---|---|
| | 00 | 01 |
| | 01 | 10 |
| | 10 | 00 |

As shown in Table 2, a left shifting pseudo random sequence generator, in accordance with the present invention, performs the same function as the right shifting version shown in FIG. 1, but in the reverse order. One actual implemented device is realized by merging the right shifting device of FIG. 1 with the left shifting device of FIG. 2. One skilled in the art can apply the teachings of the present invention to realize this merge and recreate the implemented device.

Other address ranges with other fractional powers of two can be realized by applying the principles of the present invention. For example, one skilled in the art will recognize that the range can be increased or reduced by increasing or reducing the number of memory elements in the least significant bit (LFSR) portion of the register. There is no absolute limit to the address range, but practical address ranges are typically from 4 bits to 64 bits overall. Additionally, one skilled in the art can apply the teachings of the present invention to increase the fractional use of the address range by increasing the number of memory elements and appropriately modifying the feedback logic in the most significant bit (specialized) separate portion of the register. For example, if the number of most significant bit memory cells is increased from 2 to 3, then a range of ⅞ of a power of two can be generated by using a shift-right sequence of 000, 100, 010, 101, 110, 011, 001. This sequence omits the illegal value 111 and thus excludes the top ⅛ of a power of two range. Similarly a 4 bit specialized register portion excludes the top 1⁄16 of a power of two range.

The present device can be used for any application where a pseudo-random sequence is desired and where the sequence must avoid a fraction of the values, for example to generate either addresses or data where a non-power of two is implemented or desired. This can apply for example to devices such as memory, disk, or tape. Additionally, embodiments of this device can easily be coded into software to obtain the same results.

The present device can be applied to a cache memory of any size that uses three-quarters of a power of two of address space. It generates a pseudo random sequence that is unique until all values occur exactly once. The same sequence is generated in reverse order when reversing the shift direction. The present pseudo random sequence generating device can be applied to the testing of cache memory devices having a variety of sizes that are not exact powers of two, for example a 12 k (0 to 0x2fff hexadecimal) or a 0.75M cache memory.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A pseudo random sequence generator comprising:
    a first portion configured as a linear feedback shift register (LFSR) having a first update input terminal and a plurality of sequential first memory elements, each said first memory element having a first output terminal;
    a most significant bits (MSB) second portion interconnected with said first portion, said second portion including:
        an AND gate having one input terminal connected to said first update input terminal and a different input terminal connected to a first output terminal of one of said plurality of first memory elements, said AND gate having an output terminal;
        N sequential second memory elements, each said second memory element having a second update input terminal connected to said output terminal of said AND gate, each said second memory element having a data input terminal and a data output terminal, said sequential second memory elements from a second element zero through a second element (N−1) being interconnected sequentially such that said data output terminal of said second element (N−1) is interconnected with said data input terminal of said second element zero through a feedback logic circuit; and
        such that said data output terminal of said second element zero is connected to said data input terminal of a next sequential second element.

2. The sequence generator of claim 1 wherein said first memory elements and said second memory elements are all substantially identical with one another.

3. The sequence generator of claim 2 wherein said first memory elements and said second memory elements are selected from the group consisting of master-slave latches and edge-triggered flip-flops.

4. The sequence generator of claim 1 wherein said first output terminals of said first memory elements and said data output terminals of said second memory elements are all connected to a parallel output bus.

5. The sequence generator of claim 4 wherein said parallel output bus is a 14 bit wide parallel output bus.

6. The sequence generator of claim 1 wherein said first output terminals of said first memory elements and said data output terminals of said second memory elements are all interconnected with an address port of a cache memory.

7. The sequence generator of claim 1 wherein said plurality of sequential first memory elements consists of 12 said first memory elements.

8. The sequence generator of claim 1 wherein N equals 2.

9. The sequence generator of claim 8 wherein said feedback logic circuit contains a NOR gate having an output terminal and multiple input terminals.

10. The sequence generator of claim 9 wherein said output terminal of said NOR gate is connected to said data input terminal of said second element zero.

11. The sequence generator of claim 10 wherein said data output terminals of said second element zero and said next second element respectively are each connected to a separate said input terminal of said NOR gate.

12. The sequence generator of claim 1 wherein said different input terminal of said AND gate is connected to a first output terminal of a first sequential memory element within said plurality of first sequential memory elements.

13. The sequence generator of claim 1 wherein said different input terminal of said AND gate is connected to a first output terminal of a second sequential memory element within said plurality of first sequential memory elements.

14. A method of generating a pseudo random sequence of numbers excluding a predetermined upper fraction of a power of two range, comprising:
    generating a most significant bits portion of each number within said sequence consisting of N laterally consecutive binary bits, such that the value of at least one such binary bit is a zero;
    generating said most significant bits portion of each said number within said sequence by shifting the values of the most significant bits portion of the previous number within said sequence unidirectionally by one bit from the first toward the Nth of said N consecutive bits and by simultaneously receiving a new value for said first bit, said new value obtained in response to the respective values of the most significant bits portion of the previous number within said sequence;
    generating a least significant bits portion of each said number within said sequence using pseudo random sequencing methods; and
    combining said least significant bits portion with said most significant bits portion of each number within said sequence, such that each value of said least significant bits portion is generated exactly once for each value of said most significant bits portion.

15. The method of claim 14 wherein said generating is implemented in hardware.

16. The method of claim 14 wherein said generating is implemented in software.

17. The method of claim 14 wherein said combining of said least significant bits portion with said most significant bits portion is discontinuous, such that the resulting sequence is scrambled.

18. The method of claim 17 wherein said shifting occurs when an external update bit and a predetermined bit generated by said least significant bits portion are both high.

19. The method of claim 14 wherein said unidirectional shifting occurs in a direction selected from the group consisting of a first direction and a second direction opposite said first direction.

20. The method of claim 19 wherein the pseudo random sequence generated in said second shifting direction is in a reverse order relative to the pseudo random sequence generated in said first shifting direction.

21. The method of claim 20 further comprising combining the generating of a first sequence of numbers in said first shifting direction with the generating of a second sequence of numbers in said second direction to generate a combined pseudo random sequence of numbers.

22. The method of claim 14 further comprising applying said pseudo random sequence to an address port of a cache memory.

23. The method of claim 14 wherein the total number of bits in said pseudo random sequence number is in a range from 4 bits to 64 bits.

24. The method of claim 14 wherein said excluded predetermined upper fraction of a power of two range is selected from the group consisting of one-fourth, one-eighth, and one-sixteenth.

25. The method of claim 24 wherein N equals three.

26. The method of claim 24 wherein N equals two.

27. The method of claim 26 wherein said new value is obtained by NORing the respective values of all N of the previous most significant bits portion.

* * * * *